(12) United States Patent
Gharpurey

(10) Patent No.: US 6,445,726 B1
(45) Date of Patent: Sep. 3, 2002

(54) DIRECT CONVERSION RADIO RECEIVER USING COMBINED DOWN-CONVERTING AND ENERGY SPREADING MIXING SIGNAL

(75) Inventor: Ranjit Gharpurey, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/302,604

(22) Filed: Apr. 30, 1999

(51) Int. Cl.[7] .............................................. H04L 27/30
(52) U.S. Cl. .................... 375/136; 455/314; 455/324; 375/316
(58) Field of Search ................................. 375/316, 319, 375/324, 326, 338, 340, 137, 214; 455/131, 189.1, 207, 209, 314, 313, 311, 323, 304, 324, 236.1; 329/346, 304, 306, 323, 324

(56) References Cited

U.S. PATENT DOCUMENTS

| | | | | |
|---|---|---|---|---|
| 5,303,417 A | * | 4/1994 | Laws | 455/314 |
| 5,761,615 A | * | 6/1998 | Jaffee | 455/314 |
| 5,949,830 A | * | 9/1999 | Nakanishi | 375/334 |
| 6,067,328 A | * | 5/2000 | Lewellen et al. | 375/316 |
| 6,144,846 A | * | 11/2000 | Durec | 455/323 |
| 6,175,726 B1 | * | 1/2001 | Sydon | 455/209 |
| 6,188,716 B1 | * | 2/2001 | Emery et al. | 375/147 |

* cited by examiner

*Primary Examiner*—Jean Corrielus
*Assistant Examiner*—Emmanuel Bayard
(74) *Attorney, Agent, or Firm*—Ronald O. Neerings; Wade James Brady, III; Frederick J. Telecky, Jr.

(57) ABSTRACT

A receiver (54) comprising an input for receiving an RF signal (FIG. 7) centered at a first frequency and having a bandwidth. The receiver also comprises a first mixer (62) for producing a first output signal. The first output signal results from mixing the RF signal with a signal having an energy spreading portion (p(t)) and a down-converting portion (c(t)). Moreover, this first output signal comprises a self-mixing DC signal (c(t)p(t) self-mixing DC component) and a down-converted and energy spread RF signal (FIG. 11). The receiver further comprises a second mixer (70) for producing a second output signal by mixing a signal responsive to the first output signal with the energy spreading portion of the signal. The second output signal comprises two signals, namely: (1) a baseband signal (down-converted $RFA_1$) responsive to the down-converted and energy spread RF signal; and (2) a portion of the spread DC signal (spread DC).

25 Claims, 4 Drawing Sheets

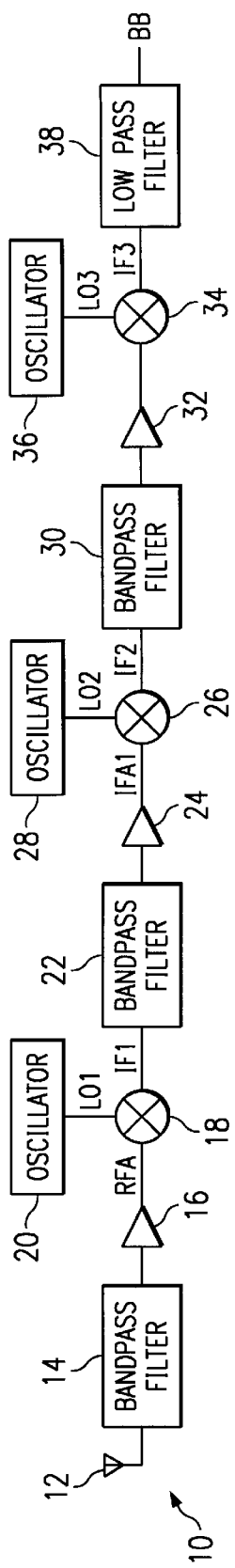
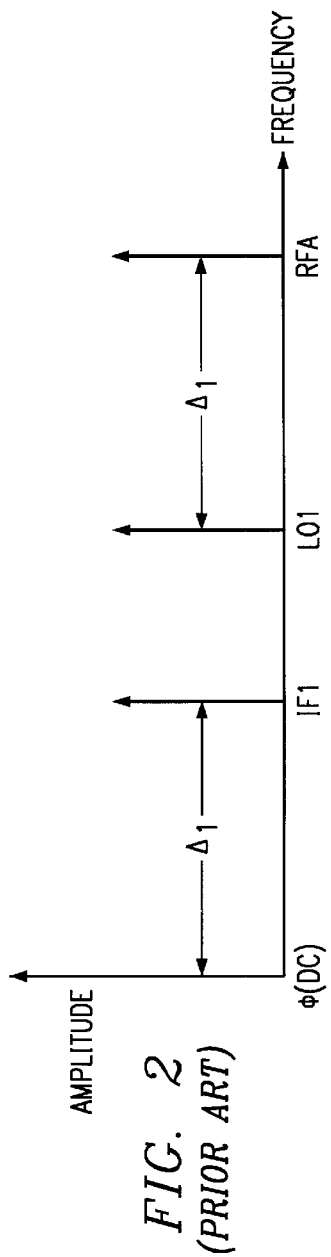
FIG. 2
*(PRIOR ART)*
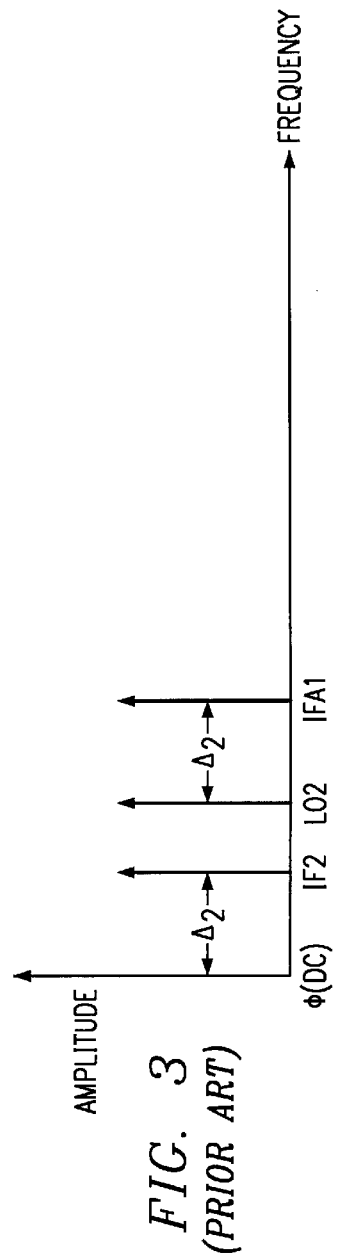
FIG. 3
*(PRIOR ART)*
FIG. 1
*(PRIOR ART)*

DIRECT CONVERSION RADIO RECEIVER USING COMBINED DOWN-CONVERTING AND ENERGY SPREADING MIXING SIGNAL

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to radio frequency receivers, and are more particularly directed to a direct-conversion radio receiver (also known as a homodyne receiver).

Radio receivers have as their ultimate goal the function of receiving an incoming radio-frequency ("RF") signal and outputting a corresponding baseband signal, typically so that the latter may be played through a speaker or the like. Two types of receivers have been developed which achieve these functions, one being a direct-conversion receiver and another being a heterodyne receiver. Generally speaking and as detailed below, each of these receivers serves the above-described goal using a different approach. By way of brief introduction to these approaches, the conversion of an incoming RF signal to a baseband signal is achieved by a direct-conversion receiver using a local oscillator which operates at the same frequency as the incoming RF signal, while a heterodyne receiver uses two or more local oscillators to progressively step down the incoming RF signal to intermediate frequency signals until the baseband result is reached.

While each of the two approaches described above has been used in various circuit implementations, each approach also involves different drawbacks, which also are introduced here. With respect to the direct-conversion receiver, it suffers from at least two drawbacks arising from its local oscillator signal. Specifically, in order to maintain good conversion gain, the local oscillator power is relatively large. As a result, some of this power leaks back toward the input of the system. This leakage has two negative effects. First, the leaking signal, which recall for a direct-conversion receiver is at the same frequency as the input signal, mixes with the input signal and continues through the receiver signal path leading to performance degradation in the receiver. Second, the leaking signal is connected back to the antenna which receives the system input and, as a result, the antenna in effect re-radiates this leaking signal into space which thereby may interfere with other receivers which are susceptible to the bandwidth of the local oscillator (and RF) signal. With respect to the heterodyne receiver, one of its drawbacks arises from its multiple bandpass filters. Specifically and as detailed below, these filters are generally included to remove so-called image signals corresponding to either the RF input signal or to any of the intermediate frequency signals. Using current methods for forming circuits, however, these bandpass filters cannot be formed in an integrated circuit; instead, they are required to be formed as discrete components. Thus, in forming a complete heterodyne receiver, each of these filters gives rise to a separate discrete component in the circuit chain, thereby increasing the number of integrated circuits involved. Consequently, cost and complexity are increased.

Two additional approaches have been implemented in the prior art to avoid certain of the problems mentioned above, but again each has its own corresponding drawbacks. In a first approach, the transmitted message signal is coded to ensure that no DC is present in the baseband message signal. On the receiving end, a high-pass filter is used in the signal path to reject any DC which does not meet the transmission restriction. However, this approach has at least three drawbacks. First, a constraint is imposed on the transmitted signal. Second, the baseband time constants are large and, thus, the capacitors in the receiver's high-pass filter are correspondingly large. Third, this approach does not address the same problem of local oscillator re-radiation into space. In a second approach, the receiver finds the average of the demodulated signal constellation, predicts the DC leakage, and then removes the predicted value from the signal. This approach also has at least three drawbacks. First, this technique requires a large number of bits in the analog-to-digital converters at the baseband because the DC leakage determines the dynamic range of the receiver. Second, this approach requires high power dissipation in the analog-to-digital converters. Third, this approach also does not address the problem of local oscillator re-radiation into space.

In view of the above, there arises a need to address the limitation of prior art receivers by providing an improved receiver which reduces or eliminates the drawbacks described above.

BRIEF SUMMARY OF THE INVENTION

In the preferred embodiment, there is a receiver comprising an input for receiving an RF signal centered at a first frequency and having a bandwidth. The receiver also comprises a first mixer for producing a first output signal. The first output signal results from mixing the RF signal with a signal having an energy spreading portion and a down-converting portion. Moreover, this first output signal comprises a self-mixing DC signal and a down-converted and energy spread RF signal. The receiver further comprises a second mixer for producing a second output signal by mixing a signal responsive to the first output signal with the energy spreading portion of the signal. The second output signal comprises two signals, namely: (1) a baseband signal responsive to the down-converted and energy spread RF signal; and (2) a portion of the spread DC signal. Other circuits, systems, and methods are also disclosed and claimed.

BRIEF DESCRIPTION OF THE SEVERAL VIEWS OF THE DRAWING

FIG. 1 illustrates a schematic of a prior art heterodyne receiver;

FIG. 2 illustrates a spectral plot with respect to the heterodyne receiver of FIG. 1 and, more particularly, of a radio frequency input signal, a first local oscillator signal, and the resulting first intermediate frequency signal;

FIG. 3 illustrates a spectral plot with respect to the heterodyne receiver of FIG. 1 and, more particularly, of a first intermediate frequency signal, a second local oscillator signal, and the resulting second intermediate frequency signal;

DETAILED DESCRIPTION OF THE INVENTION

Figure 4:
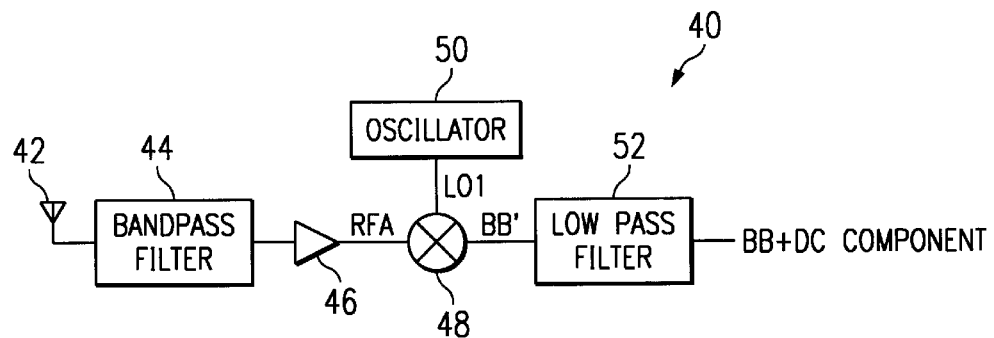
FIG. 4 illustrates a schematic of a prior art direct-conversion receiver.

FIG. 1 illustrates a schematic of a prior art heterodyne receiver designated generally at 10, and of the type introduced briefly in the previous Background Of The Invention section of this document. Receiver 10 includes a signal path which is perhaps most easily understood by looking from left to right across the drawing. In this regard and starting at the left of FIG. 1, receiver 10 includes an antenna 12 for receiving a radio-frequency ("RF") input signal which is connected through a first bandpass filter 14 to the input of a low-noise amplifier 16. The output of low-noise amplifier 16 is connected to a first input of a first mixer 18, which has a second input connected to receive a mixing signal LO1 from a first local oscillator 20. As detailed below, the output of first mixer 18 provides a first intermediate frequency signal shown as IF1 in FIG. 1.

The IF1 signal output by mixer 18 is connected through a second bandpass filter 22 to the input of a first intermediate frequency amplifier 24. The output of first intermediate frequency amplifier 24 is connected to a first input of a second mixer 26, which has a second input connected to receive a mixing signal LO2 from a second local oscillator 28. As detailed below, the output of second mixer 26 provides a second intermediate frequency signal shown as IF2 in FIG. 1.

The IF2 signal output by second mixer 26 is connected through a third bandpass filter 30 to the input of a second intermediate frequency amplifier 32. The output of second intermediate frequency amplifier 32 is connected to a first input of a third mixer 34, which has a second input connected to receive a mixing signal LO3 from a third local oscillator 36. As detailed below, the output of third mixer 34 provides a third intermediate frequency signal shown as IF3 in FIG. 1. IF3 is connected through a low-pass filter 38 and produces the baseband signal, BB, as the final output of receiver 10. BB, therefore, may be used in any desirable manner, such as to drive an audio speaker. To further appreciate this resulting signal, the operation of receiver 10 is described immediately below, with later reference to FIGS. 2 and 3 for purposes of presenting a representation of how signals are processed as they pass through the device.

In general, an RF signal is passed from antenna 12 to first bandpass filter 14 which is tuned to permit a certain range of frequencies to pass to its output. This frequency range is approximately centered at the anticipated frequency of RF, and has a bandpass range typically on the order of up to 25 percent of the RF frequency. The resulting passband is amplified by low-noise amplifier 16, thereby producing a signal shown in FIG. 1 as RFA. RFA is then mixed with LO1 from first oscillator 20 by first mixer 18, with the result shown as intermediate frequency signal IF1, as additionally detailed immediately below.

To better appreciate the formation of IF1, reference is now turned to FIG. 2 which is a spectral plot illustrating RFA output by low-noise amplifier 16 as well as LO1 from first oscillator 20. By way of introduction, note that unless stated otherwise, the spectral illustrations of FIG. 2 and the remaining spectral Figures in this document are used primarily to demonstrate relative frequencies of various signals; thus, variations in amplitude are neither shown nor discussed to simplify the discussion. In this regard and returning to the RFA and LO1 signals of FIG. 2, note that the frequency difference between these two signals is shown in FIG. 2 as $\Delta_1$. In response to RFA and LO1, first mixer 18 outputs two spectral components which represent the product of LO1 and RFA. As known in the art and as shown below, one of these components is the IF1 signal shown in FIG. 2 and exists at a frequency of DC (i.e., frequency equal to zero) plus $\Delta_1$. Since the frequency of IF1 is necessarily less than RFA, this process is sometimes referred to as beating the RFA signal with LO1, and the lower frequency result is often referred to as a down-converted or intermediate frequency signal. This terminology is why the resulting intermediate frequency signal is identified as IF1 in FIG. 2.

The IF1 signal, as well as other intermediate frequency signals discussed below, also may be demonstrated mathematically. Specifically, the resulting IF1 signal may be appreciated from the following Equation 1 which sets forth the product computed by first mixer 18:

$$\cos(\omega_{RFA}(t)) \times \cos(\omega_{LO1}(t)) = \tfrac{1}{2}[(\cos(\omega_{RFA}+\omega_{LO1}(t))+(\cos(\omega_{RFA}-\omega_{LO1}(t))] \quad \text{Equation 1}$$

where, $\omega_{RFA}$ is the frequency of RF; and $\omega_{LO1}$ is the frequency of LO1.

Equation 1 illustrates that the product produces two resulting spectral components, a first at $\tfrac{1}{2}[(\cos(\omega_{RFA}+\omega_{LO1}(t))]$ and a second at $\tfrac{1}{2}[((\cos(\omega_{RFA}-\omega_{LO1}(t))]$. The second of these spectral components is the resulting intermediate frequency signal is identified as IF1, where the mathematical relationship demonstrates that it occurs at the frequency difference, $\Delta_1$, between RFA and LO1. The first of these spectral components will necessarily appear at some frequency higher than IF1. However, given the goal of receiver 10 to produce a baseband signal at DC, note that this higher frequency signal is removed from processing by second bandpass filter 22 of FIG. 1. Thus, the first spectral component need not be detailed further and instead the remaining discussion is directed to the additional signal processing of receiver 10.

From the above derivation of IF1, one skilled in the art also should appreciate the comparable operation of second mixer 26 in producing IF2, and still further the comparable operation of third mixer 34 in producing IF3. Without re-stating the above in detail, attention is therefore now briefly turned to FIG. 3 which also depicts a spectral plot, but here relates to the formation of IF2. More specifically, recall from FIG. 2 that the IF1 signal passes through an intermediate frequency amplifier 24; thus, the signal has an increase in amplitude (not shown) and the result is referred to herein as IFA1. Thus, FIG. 3 illustrates this intermediate frequency signal IFA1 as well as the LO2 signal from second local oscillator 28. Here, the frequency difference between these two signals is shown in FIG. 3 as $\Delta_2$. In response to IFA1 and LO2, second mixer 26 produces two spectral components which represent the product of IFA1 and LO2, where one of these resulting components has a down-converted frequency and is shown in FIG. 3 as intermediate frequency signal IF2, and the other is at a higher frequency and is removed from the signal path by bandpass filter 30 (and hence not shown in FIG. 3). From this discussion, it may lastly be appreciated that third mixer 34 performs a comparable operation on IFA2 (the amplified signal corresponding to IF2), with the goal that the resulting intermediate signal IF3 will be located at or substantially near DC. Lastly, IF3 is filtered through low pass filter 38, thereby leaving the baseband signal BB as an output of receiver 10. This signal, therefore, may be used in whatever manner is desired, with the most common example being to drive a speaker or some other device for playing the baseband signal to the user of the device which includes receiver 10 (e.g., a cellular or portable telephone).

Having detailed the construction and operation of receiver 10, reference is now turned to some of its drawbacks as introduced earlier in the Background Of The Invention section of this document, and as should now be appreciated more given the preceding illustrations and discussion. Recall that a key drawback of the heterodyne receiver was described as arising from multiple bandpass filters. With reference to FIG. 1, it may now be seen by way of example that receiver 10 includes three such filters 14, 22, and 30. As noted above, two of these filters, namely, filters 22 and 30 remove the higher frequency component which results from each corresponding mixing operation. In addition and as known in the art, all three of these filters also remove image signals corresponding either to the RF input signal or to any of the intermediate frequency signals before those signals are mixed with an oscillator signal. This additional functionality is described immediately below.

By way of an example for appreciating image signals, note again that the RFA signal from antenna 12 passes through bandpass filter 14, and recall that the frequency of RFA is designated as CORFA and the frequency of LO1 is designated as $\omega_{LO1}$. Next, recall further that first mixer 18 operates to produce a resulting intermediate frequency signal IF1 in response to $\omega_{RFA}$, and recall that $\omega_{RFA}$ is at a frequency distance $\Delta_1$, greater than $\omega_{LO1}$. In other words, first mixer 18 operates with respect to a signal having a frequency of $\omega_{LO1}+\Delta_1$, and that signal is RFA. However, by virtue of the mixing operation, note further that mixer 18 also would operate with respect to a signal having a frequency of $\omega_{LO1}-\Delta_1$. In this regard, it is indeed the case that the RFA signal from antenna 12 has a corresponding image signal located at this frequency of $\omega_{LO1}-\Delta_1$. Thus, without further processing, this image signal also would be processed by first mixer 18. To avoid this operation, therefore, first bandpass filter 14 removes this image signal before it reaches first mixer 18. In this same regard, second bandpass filter 22 removes the image signal corresponding to IF1 and third bandpass filter 30 removes the image signal corresponding to IF2.

Having now detailed the functionality of the bandpass filters of receiver 10, recall that current technology does not feasibly permit such filters to be formed in an integrated circuit but, instead, they are required to be formed as discrete components. Such a requirement is particularly burdensome for a device such as receiver 10 in FIG. 1, since each filter interrupts the ability to provide a continuous signal path through a single integrated circuit. For example, low-noise amplifier 16, first mixer 18, and local oscillator 20 may be formed in a single integrated circuit, but filters 14 and 22 must then connect externally to that circuit. The same is also true of forming an integrated circuit with amplifier 24, mixer 26, and oscillator 28, and is once more true of forming an integrated circuit with amplifier 32, mixer 34, and oscillator 36. Consequently, each level of an additional local oscillator and mixer considerably increases the complexities, burdens, and limitations of having numerous integrated circuits.

FIG. 4 illustrates a schematic of a prior art direct-conversion receiver designated generally at 40, and of the type introduced briefly in the Background Of The Invention section of this document. Receiver 40 also includes a signal path which is understood by looking from left to right across the drawing and, for a portion of the device resembles receiver 10 of FIG. 1. In this regard and starting at the left of FIG. 4, receiver 40 includes an antenna 42 for receiving an RF input signal. The RF signal is connected through a first bandpass filter 44, through a low-noise amplifier 46, and to a first input of a mixer 48. The second input of mixer 48 is connected to receive a mixing signal LO1 from a local oscillator 50. As detailed below, the output of mixer 48 generally provides an output signal at or substantially near DC; therefore, this output generally corresponds to the baseband signal, and for purposes of discussion is designated as BB'. Lastly, the BB' signal is connected through a low-pass filter 52 which outputs the baseband signal, BB, from receiver 40. For reasons detailed below, an additional but undesirable DC component is also provided at the output of receiver 40.

The operation of receiver 40 is as follows. In general, RF signals are passed from antenna 42 to first bandpass filter 44 which is tuned to permit a certain range of frequencies to pass to its output. This frequency range is approximately centered at the anticipated frequency of the RF signal. For purposes of example to be used in this document, assume that the anticipated frequency of the RF signal is 100 MHz and, thus, the range of first bandpass filter 44 is tuned accordingly. Further, first bandpass filter 44 has a bandpass range equal to the bandwidth of the RF signal. Again by way of example, assume that the bandwidth of the RF signal is 200 kHz. The resulting passband is amplified by low-noise amplifier 46, thereby producing a signal shown in FIG. 4 as RFA. RFA is then mixed with a LO1 from oscillator 50 by mixer 48, with the result shown as baseband signal BB'. While the operation thus far appears to be the same as described with respect to receiver 10, above, a key difference arises as described immediately below.

Figure 5:
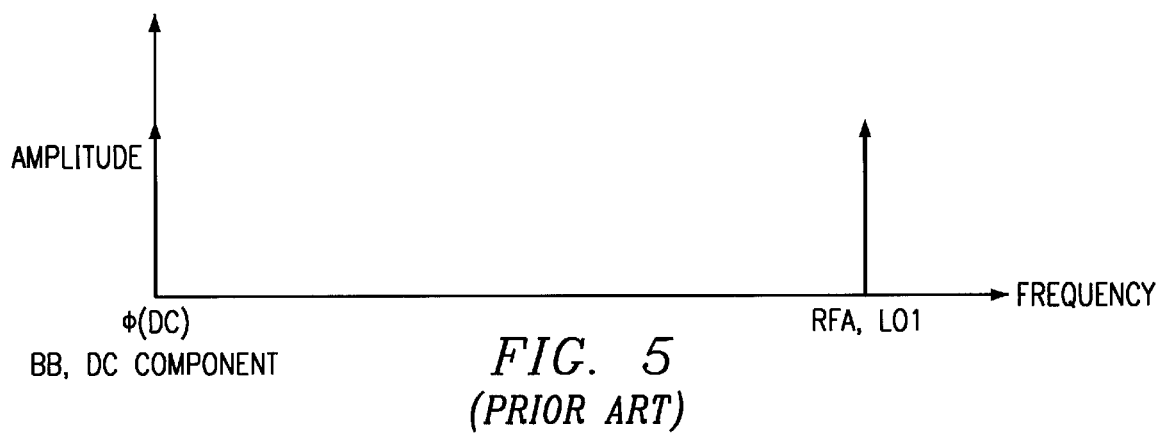
FIG. 5 illustrates a spectral plot with respect to the direct-conversion receiver of FIG. 4 and, more particularly, of a radio frequency input signal, the local oscillator signal, and the resulting baseband signals.

In the conventional direct-conversion receiver such as receiver 40, its sole oscillator 50 is tuned to a frequency, designated for the sake of discussion as $\omega_{LO1}$, which is the same as the expected frequency of the RF signal (i.e., the same as $\omega_{RFA}$). As a result, the mixing operation of mixer 48 produces two resulting spectral components according to Equation 1 as detailed in part in FIG. 5. Specifically, FIG. 5 illustrates a spectral plot of the input signals to mixer 48 as well as one of the two resulting signals. Particularly, FIG. 5 illustrates a signal component RFA; however, since LO1 from oscillator 50 is at the same frequency as that of RFA, then FIG. 5 further indicates that LO is co-aligned with RFA. In addition, since oscillator 50 is tuned such that $\omega_{LO1}$ equals $\omega_{RFA}$, then substituting these frequencies into Equation 1 yields two spectral components as shown in the following resulting Equation 2:

$$\tfrac{1}{2}[(\cos(\omega_{RFA}+\omega_{LO1}(t))+(\cos(\omega_{RFA}-\omega_{LO1}(t))]=\tfrac{1}{2}[(\cos(2\omega_{RFA}(t))+(\cos(0))]=\tfrac{1}{2}[(\cos(2\omega_{RFA}(t))]+\tfrac{1}{2}$$

Equation 2

Here again, the first addend of the solution of Equation 2 (i.e., $\tfrac{1}{2}[(\cos(2\omega_{RFA}(t))]$) is at a frequency greater than RFA and, thus, is not shown in FIG. 5 because it is eliminated from processing by low pass filter 52. However, the second addend of the solution of Equation 2 (i.e., $\tfrac{1}{2}$) is a constant and, thus, represents a DC signal. In other words and as known in the art, when a signal (e.g., RFA) is beat with another signal at the same frequency (i.e., LO1), the result includes a DC component. As a result, FIG. 5 further indicates that BB' is co-aligned with the DC axis of the Figure. Lastly in this regard, note that such a goal is the operational premise of a conventional direct-conversion receiver, that is, to use a single oscillator signal to down-convert the incoming RF signal to a DC signal. While this goal is therefore acceptable and desirable, it carries with it drawbacks introduced earlier and now explored below in greater detail having illustrated and discussed receiver 40.

Turning now to some of the drawbacks of receiver 40 and as introduced earlier in the Background Of The Invention section of this document, recall that one key drawback of the conventional direct-conversion receiver is that its oscillator power must be sufficiently large to maintain good conversion gain. As a result, however, the power of oscillator 50 leaks back to the input of mixer 48, and further back toward antenna 42. Each of these leakage paths brings with it an undesirable result. First, as to the leaking signal passed back to the input of mixer 48, it is also combined by mixer 48 with LO1 and, hence, it contributes an additional DC component to the output of mixer 48 as shown in FIG. 4 in addition to the baseband signal BB output from low pass filter 52. Indeed, it has been indicated in the prior art literature that in many practical instances the spurious DC signal can be several orders of magnitude greater than down-converted baseband signal (see, "Future Directions in Silicon ICs for RF Personal Communications," by P. R. Gray and R. G. Meyer in the Proceedings of the Custom Integrated Circuits Conference, May 1995, Santa Clara, Calif. pp. 6.1.1–6.1.8). Second, as to the leaking signal passed back to antenna 42, antenna 42 re-radiates this leaking signal into space. Recall once more that this signal is at the same or similar frequency as the RF signal and, thus, any nearby located receiver which has a bandwidth sensitive to this signal will receive this signal as interference. Indeed, this interference may span considerable distances. Moreover, often there are radio standards with severe specifications for these "in-band" reverse leakage problems and, thus, receivers such as receiver 40 must comply with these specifications or fail to be usable in certain contexts.

Figure 6:
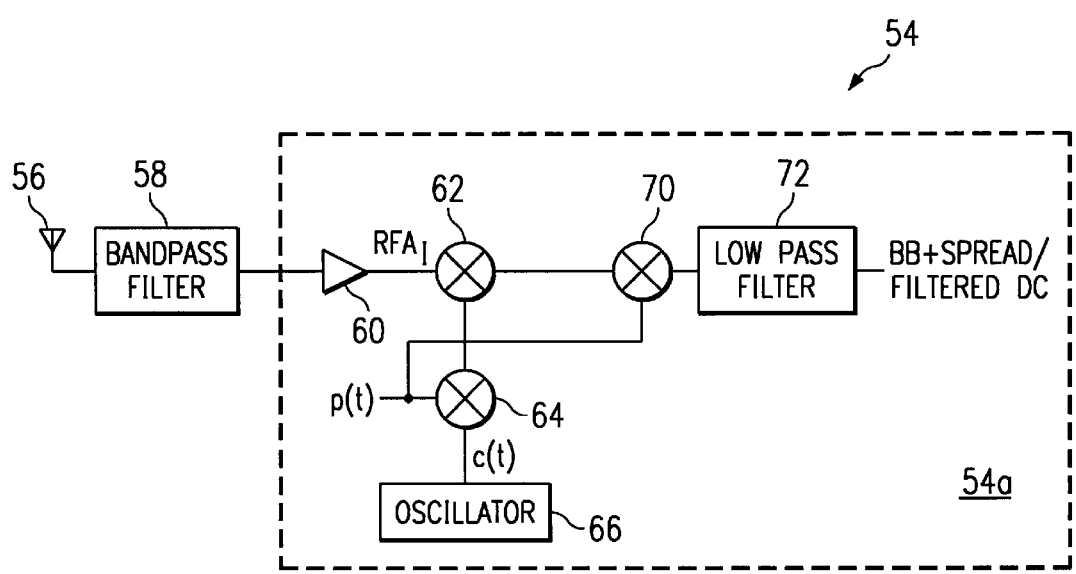
FIG. 6 illustrates a schematic of a direct-conversion receiver in accordance with the preferred embodiment.

Having now detailed various prior art approaches and corresponding drawbacks, reference is now turned to FIG. 6 which illustrates a schematic of a direct-conversion receiver 54 in accordance with the preferred inventive embodiment. Looking at the signal path of receiver 54 from left to right, it includes an antenna 56 for receiving an RF input signal. The RF signal is connected to the input of a bandpass filter 58 which is tuned to pass frequencies around the RF signal. Using the same example numbers as discussed earlier in connection with the prior art, assume again that the RF signal includes a slot that is centered at a frequency of 100 MHz, and has a bandwidth on the order of 200 kHz. Indeed, these numbers may be present in an example where a communications channel which is 2 MHz wide is divided into 10 slots, with each slot therefore being 200 kHz wide, and where the channel includes a slot centered at 100 MHz. Further in this regard, note that the RF signal may be of various types. For example, the present embodiments may apply to cellular communications, in which case each slot represents a different caller. Accordingly, each of 10 callers may be assigned a different 200 kHz slot, and the preferred embodiment will then operate with respect to the particular slot to which the receiver is tuned. Of course, this is only one example, while others may be ascertained by one skilled in the art In addition, as integrated circuit technology continues to advance, it is further contemplated that higher frequency applications will arise, and the present embodiments may be adapted by one skilled in the art to such applications. Thus, it should be understood that the frequency numbers presented in this document are by way of example, and many of the inventive teachings apply to both lower and higher frequency applications.

The output of bandpass filter 58 is connected to the input of a low-noise amplifier 60, which outputs an amplified signal indicated as $RFA_1$ for purposes of this document, with the "I" subscript used to distinguish this signal as processed by the invention in contrast to the RFA signals discussed earlier. For reasons detailed later, a dashed box 54a is shown to include amplifier 60 as well as additional components, where box 54a is intended to illustrate those items which in the preferred embodiment are formed using a single integrated circuit The output of amplifier 60 is connected to a first input of a first mixer 62. The second input of first mixer 62 is connected to the output of a second mixer 64. The first input of second mixer 64 is connected to receive a signal from a local oscillator 66 where, for purposes of this document, this oscillator signal is designated as c(t). The second input of second mixer 64 is connected to receive a pulse train signal, p(t). Each of the carrier and pulse train signals is detailed later.

Continuing with the connections of receiver 54, the output of first mixer 62 is connected to a first input of a third mixer 70. The second input of third mixer 70 is connected to receive the pulse train signal, p(t). The output of third mixer 70 is connected to the input of a low pass filter 72, which is tuned to permit signals having frequencies less than one-half of the bandwidth of the RF signal at issue to pass to its output; thus, in the example where the RF signal at issue is a slot with a bandwidth of 200 kHz, then low pass filter 72 passes frequencies under 100 kHz. The output of low pass filter 72 provides the baseband signal, BB, from receiver 54, and further includes a spread/filtered DC signal which should be appreciated by the conclusion of the operational discussion of receiver 54 as provided below.

Figure 7:
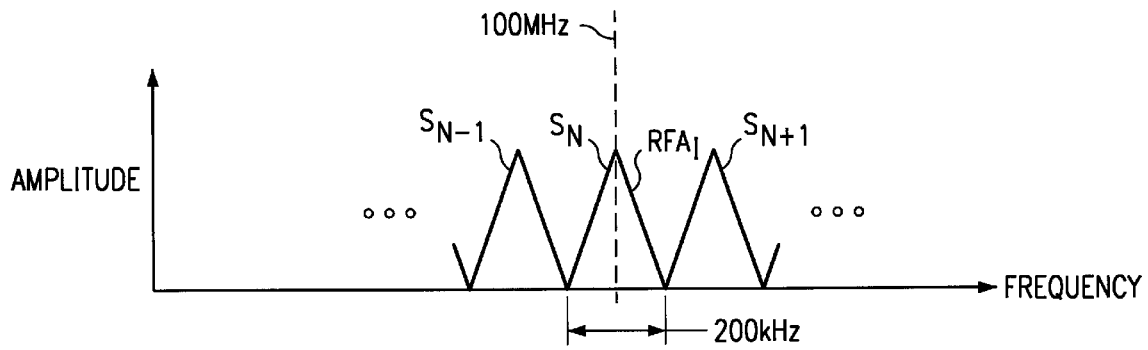
FIG. 7 illustrates a spectral plot of a radio frequency signal input to the direct-conversion receiver of FIG. 6.

The operation of receiver 54 is as follows. In general, RF signals are passed from antenna 56 to bandpass filter 58 which recall permits frequencies on the order of 100 MHz±1 MHz to pass to its output To appreciate this operation, FIG. 7 illustrates a spectral plot of the envelopes of various slots in the RF channel input to receiver 54. For purposes of the remaining discussion, slot S$hd$ N, centered at 100 MHz, is the slot being processed by receiver 54. However, consistent with the earlier discussion, slot $S_N$ is part of a channel that includes a total of ten slots and, thus, by way of illustration FIG. 7 shows both the slot $S_{N-1}$ immediately lower in center frequency than slot $S_N$ as well as slot $S_{N+1}$ immediately higher in center frequency than slot $S_N$. To simplify the drawing, however, the remaining seven slots in the RF channel are not shown. Returning to bandpass filter 58, its resulting passband output is amplified by low-noise amplifier 60, thereby producing a filtered and amplified version of the signal shown in FIG. 7, which recall is depicted in FIG. 6 as $RFA_1$. $RFA_1$ is then mixed with the product of p(t) and c(t) as provided by second mixer 64 and, to appreciate this mixing operation in greater detail, each of these signals is further discussed immediately below.

In the preferred embodiment, the oscillating signal c(t) from oscillator 66 is a sinusoidal signal having a frequency at substantially the same frequency as the center of the incoming RF signal. In the example of the FIG. 7 RF envelope centered at 100 MHz, therefore, c(t) likewise has a frequency equal to 100 MHz. Indeed, in this sole regard, the frequency of c(t) is the same as would be the case for the prior art LO signal of direct-conversion receiver 40 in FIG. 4. Thus, c(t) may be considered a down-converting signal in the present embodiment. As further appreciated below, however, this signal is further modified by combining it with p(t), thereby substantially departing from the prior art approach.

Figure 8:
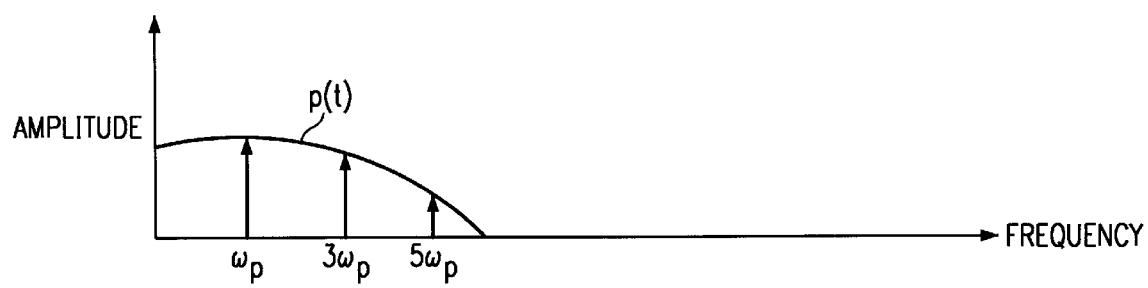
FIG. 8 illustrates a spectral plot of a pulse train signal, p(t), for the direct-conversion receiver of FIG. 6.

Turning now to p(t), and for reasons more clear below, in the preferred embodiment p(t) is a signal which switches between a magnitude of +M and −M, where the absolute value of M may be selected by one skilled in the art. In the digital logic sense, therefore, this signal may be represented as a switching between +1 and −1. Also in the preferred embodiment, the switching between equal magnitudes (but of different sign) is produced using a square wave, that is, such that a continuous sequence of equal periods is created and may be represented as +1, −1, +1, −1, and so forth. However, for reasons detailed later, in an alternative approach p(t) also may be a random pattern switching between +1 and −1. Also of note with respect to p(t) is its frequency. In the preferred embodiment, the frequency of p(t) is at substantially a frequency greater than or equal to the bandwidth of the incoming RF signal. In this regard, in the example of FIG. 7 where the RF signal being processed is a channel having a bandwidth on the order of 2 MHz, p(t) likewise has a frequency equal to 2 MHz. Having described p(t), by way of conclusion reference is also made to FIG. 8 which illustrates a spectral plot of p(t) given the preceding description. Thus, one skilled in the art will appreciate that a Fourier transform of the p(t) square wave as described above produces a common resulting spectral plot as shown in FIG. 8 (where only non-negative values for $\omega_p$ are shown). For sake of demonstrating components within the spectral envelope, three such components are shown, those being at $\omega_p$, $3\omega_p$, and $5\omega_p$, where the amplitude of each, respectively, successively decreases as known in the art.

Figure 9:
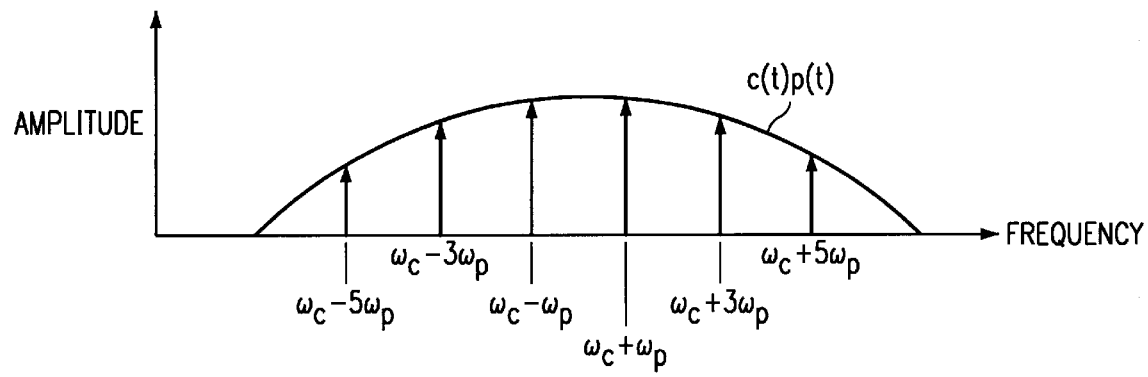
FIG. 9 illustrates a spectral plot of the pulse train signal, p(t), of FIG. 8 after multiplication with an oscillator signal, c(t)

Having now detailed c(t) and p(t), recall that those two signals are mixed by mixer 64, and the resulting product is supplied to an input of mixer 62. To further illustrate this operation, FIG. 9 illustrates a spectral plot of the result of this mixing operation. Detailing that illustration, the oscillating sinusoid c(t) has a spectral component at $\omega_c$. Moreover, the mixing operation produces components of the sum of $\omega_c$ and the integer multiples of $\omega_p$, as shown by way of example at $\omega_c+\omega_p$, $\omega_c+3\omega_p$, and $\omega_c+5\omega_p$. Additionally, the same mixing operation also produces components of the difference of $\omega^c$ and the integer multiples of $\omega_p$, as shown by way of example at $\omega_c-\omega_p$, $\omega_c-3\omega_p$, and $\omega_c-5\omega_p$. Importantly and as further explained below, therefore, note that this mixing operation by mixer 64 in effect spreads the energy of the c(t) signal over the spectrum of the envelope shown in FIG. 9. Thus, p(t) may be considered an energy spreading signal in the present embodiment. The resulting c(t)p(t) signal is then provided to an input of mixer 62 for mixing with $RFA_1$, as further detailed below.

Having now illustrated in FIGS. 7 and 9, respectively, the $RFA_1$ and c(t)p(t) inputs to mixer 62, two different observations warrant discussion. The first is the effect, or lack thereof, of reverse leakage given this operation. The second is the resulting output of mixer 62. Each of these aspects is described separately below.

An important benefit of the preferred embodiment should now be appreciated with respect to the reduced effect caused by reverse leakage. Specifically, note that to the extent there is reverse leakage at the point of operation of first mixer 62, this leakage is of a spread energy signal c(t)p(t), which is in contrast to the prior art direct conversion receiver which provides leakage at the full energy and frequency of the down-converting signal LO1. As a result of the preferred embodiment, however, the spreading effect of c(t)p(t) correspondingly reduces the net energy of the reverse leakage within the RF bandwidth. Thus, if any of the reverse leakage is re-radiated by antenna 56, the energy of that reradiated signal is also spread, so the component of this spread signal which is radiated at the frequency of RFA is far less than that provided by the prior art receiver 40. Consequently, the possibility of this re-radiated signal causing interference to other receivers is greatly reduced.

The output of first mixer 62, of course, is responsive to its inputs. In this regard, note that the input connected to amplifier 60 actually represents two signals. A first of these signals is $RFA_1$. A second of these signals, however, is any reverse leakage of c(t)p(t) which occurs back into the input of first mixer 62. Accordingly, the output of first mixer 62 is responsive to both $RFA_1$ and the c(t)p(t) reverse-leakage. Thus, for the sake of simplifying the discussion, this output is analyzed below with respect to each of these two different signals.

Turning to the output of first mixer 62 with respect to its input of c(t)p(t) reverse leakage, one skilled in the art will appreciate and it was earlier noted that a signal, when mixed with itself, produces a DC component Thus, to the extent that c(t)p(t) leaks back into the first input of first mixer 62, that portion of leakage is mixed with c(t)p(t) at the second input of first mixer 62, thereby producing a DC component. For purposes of reference, for the remainder of this document this resulting component is referred to as the c(t)p(t) self-mixing DC component. Also for the sake of later reference, this c(t)p(t) self-mixing DC component is shown as a single DC component in the spectral plot of FIG. 10. While signal amplitude has not been a primary concern for earlier spectral plots, the amplitude of the c(t)p(t) self mixing DC component illustrated in FIG. 10 will be relevant in the later discussion of how it is attenuated by a subsequent processing operation.

Figure 11:
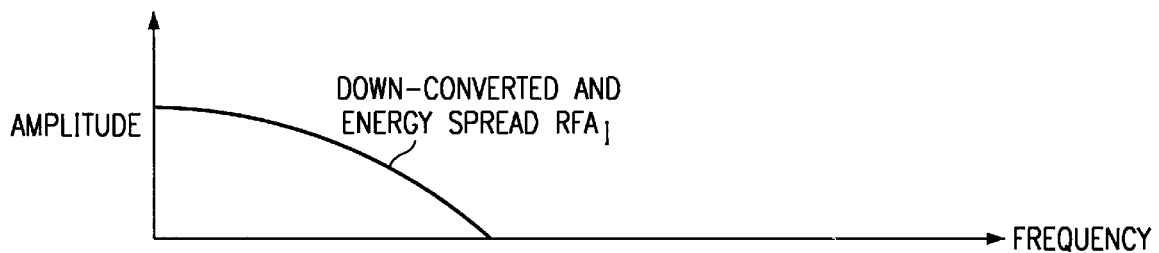
FIG. 11 illustrates a spectral plot of the down-converted and energy spread signal of the direct-conversion receiver of FIG. 6 which results from the mixing of the radio frequency signal of FIG. 7 with the resulting product signal c(t)p(t) from FIG. 9.

Turning now to the output of first mixer 62 as it relates to $RFA_1$, FIG. 11 illustrates a spectral plot of that output which is effectively the down-converted and energy spread result of mixing $RFA_1$ with c(t)p(t). Thus, the down-conversion operation effectively shifts the spectral plot of FIG. 9 to the left, thereby resulting in the plot shown in FIG. 11.

After the processing by first mixer 62, both the c(t)p(t) self-mixing DC component and the processed $RFA_1$ signal pass to third mixer 70. Third mixer 70 mixes the output of first mixer 62 with p(t). Thus, third mixer 70 produces the spectral plot shown in FIG. 12, and which necessarily reflects the mixing of p(t) with both the c(t)p(t) self-mixing DC component of FIG. 10 and the down-converted and energy spread $RFA_1$ signal of FIG. 11. Accordingly, the output of third mixer 70 is responsive to both the c(t)p(t) self-mixing DC component and the down-converted $RFA_1$. Thus, for the sake of simplifying the discussion, this output is analyzed below with respect to each of these two different signals.

Figure 10:
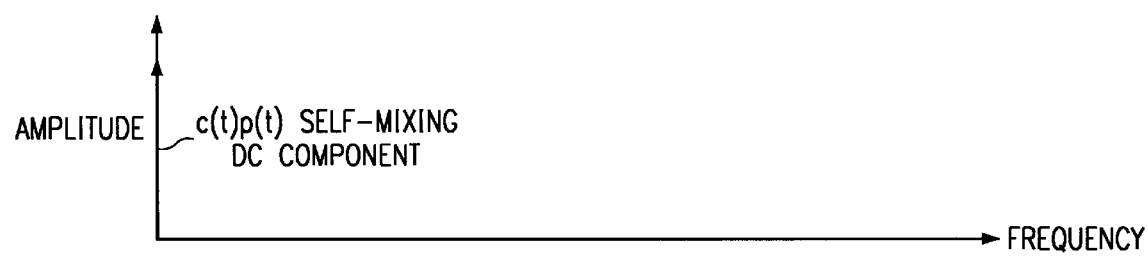
FIG. 10 illustrates a spectral plot of a DC signal which arises from reverse leakage of the p(t)c(t) signal into the input of mixer 62 of FIG. 6.
Figure 12:
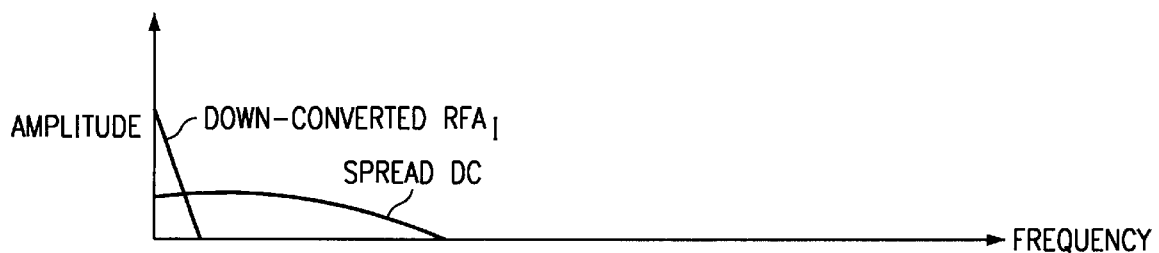
FIG. 12 illustrates a spectral plot after mixing the FIG. 10 and FIG. 11 signals with the pulse train signal, p(t)

Turning now to the output of third mixer 70 as it relates to the effect of mixing p(t) with the c(t)p(t) self-mixing DC component, note that once more a spreading effect occurs. More specifically, the operation of third mixer 70 spreads the energy of the FIG. 10 c(t)p(t) self-mixing DC component over the frequency spectrum of p(t). In FIG. 12, therefore, this result is labeled as the spread DC. Importantly, therefore, note that the peak amplitude of the spread DC envelope is considerably lower than that of the FIG. 10 c(t)p(t) self-mixing DC component. Thus, to the extent that this signal, or a portion thereof as detailed below, reaches the output of amplifier 54, its effect is considerably reduced as compared to what would occur if the same magnitude as shown in FIG. 10 were allowed to reach the amplifier output.

Turning now to the output of third mixer 70 as it relates to the effect of mixing p(t) with the down-converted and energy spread $RFA_1$, signal, recall that the output of first mixer 62, which connects to the input of third mixer 70, has earlier been processed once using p(t). More specifically, this earlier processing occurred from the use of the product c(t)p(t) as provided to first mixer 62. Thus, one skilled in the art should now appreciate that the additional mixing operation of third mixer 70 forms a new product, where this new product includes p(t) a second time, thereby resulting in a signal processed twice with p(t). In other words, at this point in the signal path, there is a combined product which includes $[p(t)]^2$. Recall further that p(t) in the preferred embodiment transitions between −1 and +1. Thus, the product $[p(t)]^2$ at any instant of time t equals one (i.e., either $[+1]^2$ or $[-1]^2$ equals 1). As a result, at the point of the output of third mixer 70, the operation of first mixer 62 as it related to $RFA_1$, and involved p(t) is effectively negated by the operation of third mixer 70 which again involves p(t). In other words and mathematically speaking, after the second use of p(t) by third mixer 70, $RFA_1$ has been multiplied times one, thereby substantially reconstructing the $RFA_1$ signal at the output of mixer 70. In FIG. 12, therefore, this result is labeled as the down-converted $RFA_1$ signal because it has a magnitude that is a linear scaled version of the bandwidth signal modulated by the RF signal, but it has been down-converted from the frequency at which it was received (e.g., 100 MHz) to a lower frequency; moreover, because c(t) was set to substantially the same frequency as the RF signal, then the down-conversion takes RF all he way to DC and, thus, the down-converted $RFA_1$ represents a baseband signal. Still further in regard to the effect of p(t), recall it was earlier noted that p(t) may randomly switch between +1 and −1. It should now be appreciated that such randomness will indeed often provide a workable alternative given that even with the random switching the net effect of $[p(t)]^2$ at any given time t will equal one. Further in this regard, the random switching may be from one frequency to another frequency and so forth, or alternatively may be random with respect to the time of each transition relative to the preceding transition. In either case, however, the transitions must be such that p(t) is still at substantially a frequency greater than or equal to the bandwidth of the overall incoming RF signal (e.g., the overall channel bandwidth). Lastly with respect to p(t), it should be noted that the present inventor has further determined that the faster the transition time of p(t) (i.e., between +1 and −1), the greater the elimination of image frequencies in the processed signal.

Figure 13:
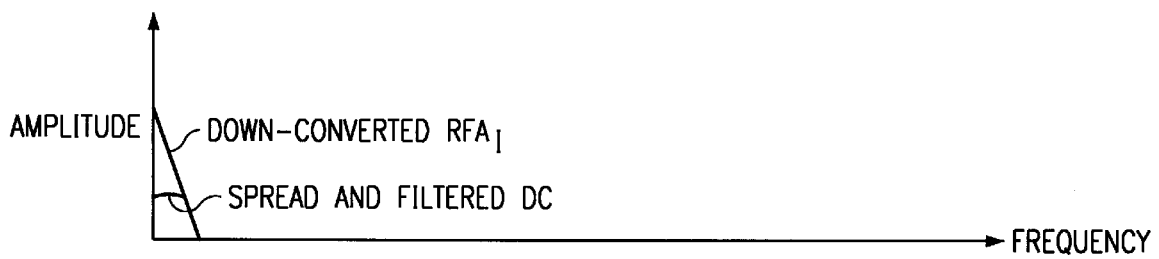
FIG. 13 illustrates a spectral plot of the output signal for the direct-conversion receiver of FIG. 6, which corresponds to the FIG. 12 signal after it is processed with a low pass filter.

After the processing by third mixer 70, both the spread DC and the down-converted $RFA_1$ signals as depicted in FIG. 12 are passed through low pass filter 72. Recall that low pass filter 72 is tuned to pass only frequencies less than one-half of the bandwidth of the expected baseband signal, and by way of example therefore the frequencies that pass may be on the order of 100 kHz. As a result, any frequency components above 100 kHz are removed, thereby producing the resulting spectral plot shown in FIG. 13. More specifically, since low pass filter 72 passes signals under 100 kHz, it does not affect the down-converted $RFA_1$ signal from FIG. 12, which therefore re-appears in the same manner in FIG. 13. Thus, this final output of $RFA_1$ is effectively the fully processed baseband signal BB, and may be used accordingly. In addition, note that a portion of the spread DC signal from FIG. 12 is within the passband of low pass filter 72. As a result, this portion of the spread DC signal is also shown in FIG. 13, but since it has been processed as just described it is labeled as spread and filtered DC. Also in this regard, however, note that the spread and filtered DC of FIG. 13 is only a relatively small portion of the spread DC signal from FIG. 12. From this one skilled in the art should now further appreciate the beneficial effect produced by the preferred embodiment in spreading the c(t)p(t) self-mixing DC component with p(t). Particularly, because the signal is spread over a relatively wide range of frequency, the subsequent filtering operation results in an overall lesser portion of its energy effectively reaching the output of amplifier 54 and, hence, any negative effect of that signal is considerably reduced.

From the above it may be appreciated that the above embodiments provide numerous improvements over the prior art. For example and as detailed above, the effects of re-radiation are considerably reduced if not eliminated. As another example and also as detailed above, the effect of any self-mixing DC component introduced into the amplifier signal path is substantially reduced by spreading the energy of that signal over a wider bandwidth and then filtering it so that only a small percentage of its gross energy reaches the amplifier output. As still another example, note now that the preferred embodiment permits a substantial portion of amplifier 54 to be included in a single integrated circuit 54*a* because it does not require numerous bandpass filters along its signal path as does the heterodyne receiver of the prior art. As still another example, it is noted that the amplifier of the preferred embodiment may be implemented in various different types of devices. As a final example to the benefits of the preferred embodiments, note that while the present embodiments have been described in detail, various substitutions, modifications or alterations could be made to the descriptions set forth above without departing from the inventive scope. This inventive scope, therefore, is defined by the following claims.

What is claimed is:

1. A receiver, comprising:
   an input for receiving an RF signal centered at a first frequency and having a bandwidth;
   a first mixer for producing a first output signal by mixing the RF signal with a signal having an energy spreading portion and a down-converting portion, wherein the first output signal comprises a self-mixing DC signal and a down-converted and energy spread RF signal; and
   a second mixer for producing a second output signal by mixing a signal responsive to the first output signal with the energy spreading portion of the signal, such that the second output signal comprises:
      a baseband signal responsive to the down-converted; and
      an energy spread RF signal and a spread DC signal responsive to the self-mixing DC signal.

2. The receiver of claim 1 and further comprising an amplifier, wherein the RF signal is output by the amplifier to the input and represents an amplified signal corresponding to a lower amplitude input RF signal that is input to the amplifier.

3. The receiver of claim 2 and further comprising an antenna for receiving a radio signal and in response for providing the lower amplitude input RF signal in response to the radio signal.

4. The receiver of claim 2 and further comprising a first low pass filter coupled to the output of the second mixer, wherein the first low pass filter is for producing an output which comprises only a portion of the spread DC signal.

5. The receiver of claim 4 wherein each of the amplifier, first mixer, first low pass filter, and second mixer are formed using a single integrated circuit.

6. The receiver of claim 1 wherein the energy spreading portion of the signal has a frequency greater than or equal to the bandwidth.

7. The receiver of claim 6 wherein the down-converting portion of the signal has a frequency approximately equal to the first frequency.

8. The receiver of claim 1 wherein the energy spreading portion of the signal comprises a square wave.

9. The receiver of claim 1 wherein the energy spreading portion of the signal comprises a signal having an amplitude change between a value of +M and a value of −M.

10. The receiver of claim 9 wherein the signal having an amplitude change between a value of +M and a value of −M switches randomly from a first frequency to a second frequency, wherein each of the first frequency and the second frequency is greater than or equal to the bandwidth.

11. The receiver of claim 9:
wherein the signal having an amplitude change between a value of +M and a value of −M switches randomly with respect to each transition time relative to a preceding transition; and
wherein each transition is such that the energy spreading portion of the signal is at substantially a frequency greater than or equal to the bandwidth.

12. The receiver of claim 1 wherein the baseband signal has a magnitude approximately equal to the RF signal.

13. The receiver of claim 1 and further comprising:
an amplifier, wherein the RF signal is output by the amplifier to the input and represents an amplified signal corresponding to a lower amplitude input RF signal that is input to the amplifier;
a first low pass filter coupled to the output of the second mixer, wherein the first low pass filter is for producing an output which comprises only a portion of the spread DC signal;
wherein each of the amplifier, first mixer, first low pass filter, and second mixer are formed using a single integrated circuit; and
wherein the energy spreading portion of the signal has a frequency approximately equal to the bandwidth.

14. The receiver of claim 13 wherein the down-converting portion of the signal has a frequency approximately equal to the first frequency.

15. The receiver of claim 1 wherein the RF signal comprises a cellular telephone RF signal.

16. The receiver of claim 1 wherein the RF signal comprises a slot selected among a plurality of slots in a channel.

17. The receiver of claim 1 wherein the first output signal is connected directly to an input of the second mixer.

18. A method of signal processing, comprising:
receiving an RF signal centered at a first frequency and having a bandwidth;
forming a first output signal by mixing the RF signal with a signal having an energy spreading portion and a down-converting portion, wherein the formed first output signal comprises a self-mixing DC signal and a down-converted and energy spread RF signal; and
forming a second output signal by mixing a signal responsive to the first output signal with the energy spreading portion of the signal, such that the second output signal comprises:
a signal responsive to the down-converted and energy spread RF signal; and
a spread DC signal responsive to the self-mixing DC signal.

19. The method of claim 18 wherein the signal responsive to the down-converted and energy spread RF signal comprises a baseband signal having a magnitude approximately equal to the RF signal.

20. The method of claim 17 wherein the energy spreading portion of the signal has a frequency approximately equal to the bandwidth.

21. The method of claim 20 wherein the down-converting portion of the signal has a frequency approximately equal to the first frequency.

22. The method of claim 18 wherein the energy spreading portion of the signal comprises a square wave.

23. The method of claim 18 wherein the energy spreading portion of the signal comprises a signal having a random amplitude change between a value of +M and a value of −M.

24. The method of claim 23 wherein the signal having an amplitude change between a value of +M and a value of −M switches randomly from a first frequency to a second frequency, wherein each of the first frequency and the second frequency is greater than or equal to the bandwidth.

25. The method of claim 23:
wherein the signal having an amplitude change between a value of +M and a value of −M switches between the value of +M and the value of −M at random transition times; and
wherein each transition time is such that the energy spreading portion of the signal is at substantially a frequency greater than or equal to the bandwidth.

\* \* \* \* \*